July 29, 1969 L. J. W. JOHNSON 3,457,638

MANUFACTURE OF PRINTED CIRCUITS

Filed Feb. 27, 1967

INVENTOR
Leonard J. W. Johnson
BY Kinnon Kramer Stewart & Estabrook
ATTORNEY

United States Patent Office 3,457,638

Patented July 29, 1969

3,457,638

MANUFACTURE OF PRINTED CIRCUITS

Leonard J. W. Johnson, Hitchin, England, assignor to British Aircraft Corporation (Operating) Limited, London, England, a British company Filed Feb. 27, 1967, Ser. No. 618,891
Claims priority, application Great Britain, Mar. 1, 1966, 8,961/66
Int. Cl. H05k *3/06;* B41m *3/08*
U.S. Cl. 29—625 4 Claims

ABSTRACT OF THE DISCLOSURE

Double sided printed circuit boards are produced by coating insulating boards on both sides with conducting material, further coating with resist materials, forming holes through the boards, sensitizing and plating the walls of same; the final printed circuit board is formed after removal of the resist materials.

It is often necessary to produce double sided printed circuit boards, that is to say boards having circuit patterns on both faces and usually the circuit patterns on one face will be required to link with the circuit patterns on the opposite face at various points on the board. To enable this to be done a "through plating" technique is used, holes being drilled through the printed circuit board where connections are required between the two faces and the side faces of the holes then plated. The initial board may be a plastic sheet having its outer faces coated with copper and when the holes have been drilled through the board at the appropriate positions and the board has been cleaned with, for example, trichloroethylene, a coating of reduction copper is formed. The board is then plated with copper by an electrolytic process which is intended not only to coat the faces and edges of the board, but also to deposit copper on the walls of the holes which have been drilled through. However, in practice the copper is not thrown down the holes sufficiently to coat the walls completely and an unsatisfactory product is sometimes obtained.

According to the present invention a printed circuit board which has been coated with a layer of conducting material on both sides is coated with two successive resist materials having different solvents and holes are then formed through the board at the required interconnection points; the board is then dipped in a sensitising solution as a preparation for the subsequent plating of a conducting material and the resulting sensitised coating is removed from the two sides of the board by washing off the outer layer of resist material with the appropriate solvent, thereby exposing the inner layer of resist material and leaving the sensitised coating adhering only to the walls of the holes. The board is then immersed in a plating solution and the said walls are electroplated to provide the interconnections. Thereafter the final printed circuit board is formed after the inner layer of resist material has been washed away with a different solvent. In a preferred form of the invention, the holes are drilled through the board after the application of the two resist coatings and the board is then rinsed in an acid solution to "etch off" the burr left on the edges of the drilled holes in the layer of conducting material.

One example of a method according to the invention which can be carried out as a continuous process is shown in the accompanying drawing, in which the sole figure shows the various layers being built up and removed from the insulating board.

Referring to the figure a film 1 0.002 inch thick of glass fabric impregnated with epoxy resin is taken and a copper film is deposited on both sides of the glass fabric.

Figure 1A:
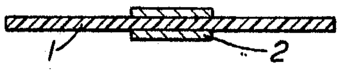
Figure 1B:
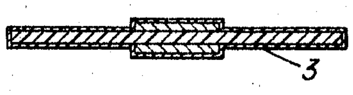
Figure 1C:
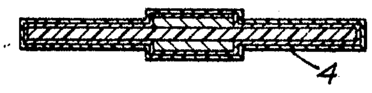
Figure 1D:
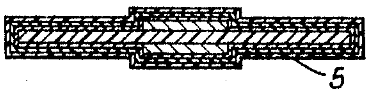
Figure 1E:
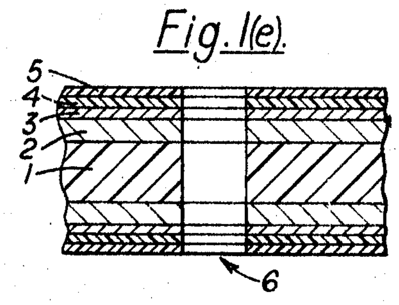

Circuit configurations are marked on and etched out of the copper surfaces by known methods to produce a number of circuit tracks 2 (FIGURE 1*a*). The entire "board" is then immersion coated with copper to a thickness of approximately 10 micronich (FIGURE 1*b*) and this fine coating 3 acts as a conducting path between isolated track elements. Next, the board is covered completely with a resist material 4 (FIGURE 1*c*) and then with a further resist material 5 (FIGURE 1*d*). The two resist materials are dissolvable in different solvents and therefore can be washed away independently. Holes are then drilled through the board where required (FIGURE 1*e*) and the board is rinsed in an acid solution to remove the burr. The rinse also smooths the walls of the holes, but does not attack either of the resist coatings.

Figure 1F:
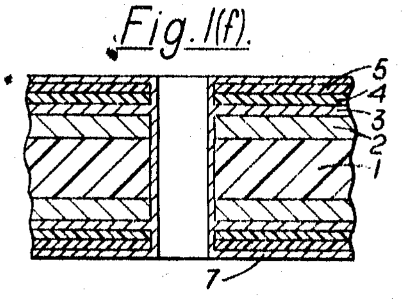
Figure 1G:
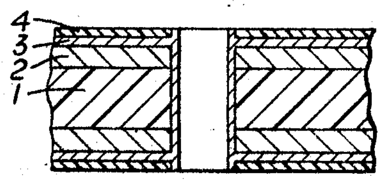
Figure 1H:
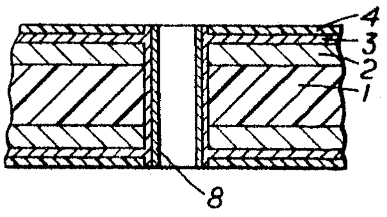
Figure 1I:
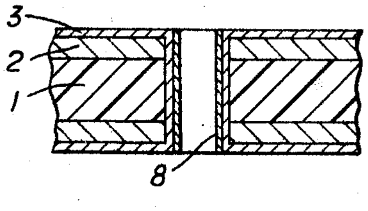
Figure 1J:
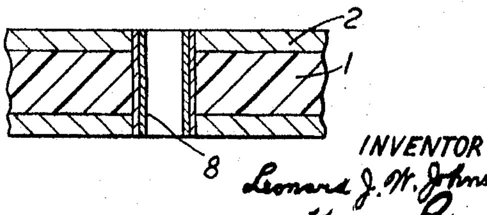

The board is then dipped in a sensitising solution as a preparation for a later step of electroless plating. One example of a sensitising agent is palladium chloride. The sensitised coating 7 is formed over both sides of the board as well as around the walls of the drilled holes (FIGURE 1*f*) but since it is only the walls of the holes which are to be plated the sensitised coating is next removed from the sides of the board by washing off the outer layer of resist material 5 using an appropriate solvent (FIGURE 1*g*). This is possible since the deposit left by the sensitising agent is extremely thin and porous and allows the resist solvent to pass through it. The board can now be dipped into an electroless copper solution and the walls of the holes are consequently plated with a coating of copper 8 (FIGURE 1*h*). This coating may subsequently be electroplated to the required thickness, after which the first resist 4 is washed off (FIGURE 1*i*) and the copper coating 3 is removed (FIGURE 1*j*) by immersing the board in a corrosive fluid such as nitric acid for a time just sufficient to remove that coating.

In an alternative process according to the invention, an insulating board having copper or nickel faces, is coated with the two successive resist layers. After the holes have been drilled and plated, as described above, then if the first resist is selected as an etching resist which may be photo-sensitised in the normal way, a standard printed circuit process can then be carried out, provided the walls of the holes are first gold plated to provide on them an acid resist layer so that they will not be affected by the later etching process.

Alternatively, if the first resist is not an etching resist capable of being photo-sensitised, it is washed off after the electroplating and a fresh acid resist is then applied to the surfaces of the board. Thereafter, the normal printed circuit process is carried out, the resist coating being sensitised and subjected to ultra violet light to form a circuit pattern.

I claim:

1. In the preparation of a double sided printed circuit board, a method of preparing the interconnections between both sides of the board comprising the steps of:

(a) coating an insulating board on both sides with a layer of conducting material;

(b) further coating the board with successive resist materials having different solvents;

(c) forming holes through the board at the required interconnection points;

(d) immersing the board in a sensitizing solution as a preparation for the subsequent plating of a conducting material;

(e) removing the resulting sensitised coating from the two sides of the board by washing off the outer layer of resist material with the appropriate solvent, thereby exposing the inner layer of resist material and leaving the sensitised coating adhering only to the walls of the holes;

(f) immersing the board in a plating solution whereby the said walls are electroplated to provide the said interconnection; and (g) subsequently washing away the inner layer of resist material with a different solvent.

2. A method of preparing a double sided printed circuit board comprising the steps of:

(a) coating an insulating board on both sides with a layer of conducting material;

(b) further coating the board with successive resist materials having different solvents;

(c) forming holes through the board at the required interconnection points;

(d) immersing the board in a sensitising solution as a preparation for the subsequent plating of a conducting material;

(e) removing the resulting sensitised coating from the two sides of the board by washing off the outer layer of resist material with the appropriate solvent, thereby exposing the inner layer of resist material and leaving the sensitised coating adhering only to the walls of the holes;

(f) immersing the board in a plating solution whereby the said walls are electroplated to provide the said interconnections;

(g) subsequently washing away the inner layer of resist material with a different solvent;

(h) coating a layer of etching resist material over the said coating of conducting material;

(i) exposing the required track pattern onto the etching resist on both sides of the board; and (j) subsequently etching out the track pattern in the said coating of conducting material.

3. A method of preparing a double sided printed circuit board comprising the steps of:

(a) coating an insulating board on both sides with a layer of conducting material;

(b) further coating the board with successive resist materials having different solvents, the first coating of resist material comprising an etching resist;

(c) forming holes through the board at the required interconnection points;

(d) immersing the board in a sensitising solution as a preparation for the subsequent plating of a conducting material;

(e) removing the resulting sensitised coating from the two sides of the board by washing off the outer layer of resist material with the appropriate solvent, thereby exposing the inner layer of resist material and leaving the sensitised coating adhering only to the walls of the holes;

(f) immersing the board in a plating solution whereby the said walls are electroplated to provide the said interconnections;

(g) further plating the holes with an acid resist material;

(h) exposing the said etching resist material to the circuit track pattern;

(i) selectively washing away the said etching resist material with a different solvent; and (j) etching out the required circuit pattern from the said coating of conducting material.

4. A method according to claim 1, further comprising removing the burr left on the edges of the holes by rinsing the board in an acid solution after the application of the two resist coatings.

References Cited

UNITED STATES PATENTS

| | | | |
|---|---|---|---|
| 3,340,607 | 9/1967 | Shutt | 29—625 |
| 3,370,351 | 2/1968 | Freehauf et al. | 29—625 |

JOHN F. CAMPBELL, Primary Examiner

R. W. CHURCH, Assistant Examiner

U.S. Cl. X.R.

29—628; 117—212; 153—3, 11; 174—68.5; 204—15